(12) United States Patent
Han

(10) Patent No.: US 7,572,663 B2
(45) Date of Patent: Aug. 11, 2009

(54) METHOD FOR MANUFACTURING CMOS IMAGE SENSOR

(75) Inventor: Chang Hun Han, Icheon-si (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 348 days.

(21) Appl. No.: 11/615,096

(22) Filed: Dec. 22, 2006

(65) Prior Publication Data

US 2007/0148811 A1   Jun. 28, 2007

(30) Foreign Application Priority Data

Dec. 28, 2005   (KR) .................. 10-2005-0132483

(51) Int. Cl.
*H01L 31/18* (2006.01)
(52) U.S. Cl. ................... 438/58; 438/60; 438/145; 438/476; 257/E27.133
(58) Field of Classification Search .......... 438/58
See application file for complete search history.

(56) References Cited

U.S. PATENT DOCUMENTS 6,908,839 B2 * 6/2005 Rhodes ............... 438/595
2003/0096442 A1 5/2003 Lee
2004/0021060 A1 * 2/2004 Ohkawa ............... 250/214.1
2004/0046193 A1 3/2004 Park et al.
2005/0218455 A1 * 10/2005 Maeda et al. .......... 257/368
2005/0275034 A1 12/2005 Deshpande et al.
2007/0012963 A1 * 1/2007 Han ..................... 257/290

FOREIGN PATENT DOCUMENTS

KR   2004-0008683 A   1/2004
KR   2004-0058708 A   7/2004

* cited by examiner

*Primary Examiner*—Stephen W Smoot
(74) *Attorney, Agent, or Firm*—Saliwanchik, Lloyd & Saliwanchik

(57) ABSTRACT

A method for manufacturing a CMOS image sensor is provided. The method can include forming an interlayer dielectric layer on a semiconductor substrate including a gate electrode, photodiode area, and LDD region; selectively removing the interlayer dielectric layer such that the interlayer dielectric layer remains on the photodiode area; performing a first heat treatment process; sequentially forming a first insulating layer and a second insulating layer on the semiconductor substrate, where the etching selectivity of the first insulating layer is different from the etching selectivity of the second insulating layer; selectively etching the second insulating layer to form spacers on sidewalls of the gate electrode; selectively removing the first insulating layer to expose a source/drain area and forming a high-density N-type diffusion area in the exposed source/drain area; performing a second heat treatment process; and forming a metal silicide layer the high-density N-type diffusion area.

8 Claims, 8 Drawing Sheets

METHOD FOR MANUFACTURING CMOS IMAGE SENSOR

RELATED APPLICATION(S)

This application claims priority under 35 U.S.C. §119(e) of Korean Patent Application No. 10-2005-0132483 filed Dec. 28, 2005, which is incorporated herein by reference in its entirety.

FIELD OF THE INVENTION

The present invention relates to a method for manufacturing a CMOS image sensor.

BACKGROUND OF THE INVENTION

In general, an image sensor refers to a semiconductor device for converting an optical image into an electrical signal. Image sensors are generally classified as charge coupled device image sensors or CMOS image sensors. A charge coupled device (CCD) image sensor includes metal-oxide-silicon (MOS) capacitors formed very close to each other where charge carriers are stored in and transferred from the capacitors.

A CMOS image sensor is a device employing a switching mode to sequentially detect an output by providing MOS transistors corresponding to the number of pixels, formed using a CMOS technology, in conjunction with peripheral devices, such as a control circuit and a signal processing circuit.

A charge coupled device (CCD) has various disadvantages such as a complicated drive mode and high power consumption. Also, the CCD requires many steps of the mask processes, so the process for the CCD is complicated. In addition, it is difficult to integrate a signal processing circuit onto a single chip of the CCD. Recently, to overcome these disadvantages, CMOS image sensors using a sub-micron CMOS manufacturing technology have been studied and developed.

The CMOS image sensor includes a photodiode and a MOS transistor in each unit pixel to sequentially detect the signal through a switching scheme, thereby realizing the images. Since the CMOS image sensor makes use of the CMOS manufacturing technology, the CMOS image sensor has low power consumption and simplifies the manufacturing process thereof. That is, the CMOS sensor manufacturing process can be achieved by using about 20 masks in contrast with the 30 to 40 masks required by the CCD process. Also, because many signal processors can be integrated onto a single chip of the CMOS image sensor, the CMOS image sensor is spotlighted as a next-generation image sensor. Therefore, the CMOS image sensor is used in various applications such as digital still cameras (DSC), PC cameras, and mobile cameras.

The CMOS image sensors are classified as 3T-type, 4T-type, or 5T-type CMOS image sensors based on the number of transistors formed in a unit pixel. The 3T-type CMOS image sensor includes one photodiode and three transistors, and the 4T-type CMOS image sensor includes one photodiode and four transistors. Hereinafter, description will be made in reference to a layout of a unit pixel of the 3T-type CMOS image sensor.

FIG. 1 is a layout view illustrating the unit pixel of a conventional 3T-type CMOS image sensor.

As shown in FIG. 1, the unit pixel of the 3T-type CMOS image sensor includes one photodiode PD and three transistors.

The three transistors include a reset gate Rx for resetting optical charges collected in the photodiode PD, a drive gate Dx serving as a source follower buffer amplifier, and a select gate Sx performing switching and addressing functions.

Herein, a photodiode area (B) including the photodiode PD is an area in which salicide is not formed, and the area excluding the photodiode area (B), that is, a logic area, is the area in which salicide is formed.

The reason for forming salicide in the logic area is to reduce the resistance, thereby improving the speed of the transistors Rx, Dx and Sx. In addition, salicide is not formed in the photodiode area (B) because salicide reflects light which may interfere with the function of the photodiode PD that reproduces images by receiving the light.

FIG. 2 is a sectional view taken along line A-A' of FIG. 1, showing the photodiode PD and the reset gate Rx.

As shown in FIG. 2, a reset gate 3 is formed on a semiconductor substrate 1 including a high-density P++ semiconductor substrate and a P-Epi layer with a gate insulating layer 2 interposed therebetween. A photodiode impurity region 4 (hereinafter referred to as "PDN") is formed in the photodiode area (B) at one side of the reset gate 3.

In addition, an N+ diffusion area 5 is formed in the semiconductor substrate 1 at the other side of the reset gate 3, and insulating layer sidewalls 6 are formed at both sides of the reset gate 3. Further, an LDD area 7 is formed in the semiconductor substrate 1 at the lower part of the insulating layer sidewall 6, and is formed in the vicinity of the N+ diffusion area 5.

As described above, since a salicide layer 8 must not be formed in the photodiode area (B) while being formed only in the logic area, the salicide layer 8 is not formed on the portion of the reset gate 3 formed in the photodiode area (B). The salicide layer 8 is formed on the portion of the reset gate 3 formed in the logic area and on the N+ diffusion area 5. Here, reference numeral 9 is an isolation layer.

FIGS. 3a through 3i are sectional views showing a procedure for manufacturing a conventional CMOS image sensor.

Referring to FIG. 3a, an epitaxial process is performed relative to a semiconductor substrate 100 including high-density first conductive (P++ type) multi-crystalline silicon, thereby forming a low-density first conductive (P– type) epitaxial layer 101.

Here, the epitaxial layer 101 enlarges and deepens a depletion region of the photodiode, thereby increasing the capability and the photo sensitivity of a low-voltage photodiode for collecting optical charges.

Then, an active area and an isolation area are defined on the semiconductor substrate 100, and a STI process or a LOCOS process is performed, thereby forming an isolation layer 102 on the isolation area.

After that, a gate insulating layer 103 and a conductive layer are sequentially deposited on the entire surface of the epitaxial layer 101 having the isolation layer 102. The conductive layer and the gate insulating layer 103 are selectively removed, thereby forming a gate electrode 104 of each transistor.

Then, a first photoresist film 105 is coated on the entire surface of the semiconductor substrate 100 including the gate electrode 104, and then an exposure and development process is performed so as to selectively pattern the first photoresist film 105 such that the photodiode area can be exposed.

Thereafter, low-density N– type dopants are implanted into the exposed photodiode area using the first photoresist film 105 as a mask, thereby forming a PDN area 106.

Referring to FIG. 3b, after completely removing the first photoresist film 105, a second photoresist film 107 is coated on the entire surface of the semiconductor substrate 100, and then an exposure and development process is performed relative to the second photoresist film 107 such that the transistor area can be exposed. Thereafter, low-density N− type dopants are implanted into the epitaxial layer 101 using the second photoresist film 107 as a mask to form an LDD area 108.

Herein, the PDN area 106 is formed deeper than the LDD area 108 because dopants are implanted into the photodiode area with a higher energy to form the PDN area 106.

Referring to FIG. 3c, after completely removing the second photoresist film 107, a TEOS layer 109 having a thickness of about 200 Å is formed on the entire surface of the semiconductor substrate 100, and a nitride layer 110 is formed on the TEOS layer 109.

Referring to FIG. 3d, a nitride layer sidewall 110a is formed at both sides of the gate electrode 104 by performing an etch-back process on the entire surface of the nitride layer 110.

Referring to FIG. 3e, a third photoresist film 111 is coated on the entire surface of the semiconductor substrate 100, and an exposure and development process is performed relative to the third photoresist film 111 such that the third photoresist film 111 remains only on the photodiode area and the isolation layer 102 to expose source/drain areas of the transistors.

Thereafter, high-density N+ type dopants are implanted into the exposed source/drain area by using the third photoresist film 111 as a mask, thereby forming a high-density N+ type diffusion area 112.

Referring to FIG. 3f, after removing the third photoresist film 111, a heat treatment process (e.g., a rapid thermal process of 800° C. or higher) is performed, thereby diffusing the dopants in the N− type diffusion area 106, the low-density N− type diffusion area 108 and the high-density N+ type diffusion area 112.

Then, a silicide blocking layer 113 is formed on the entire surface of the semiconductor substrate 100.

Referring to FIG. 3g, after coating a fourth photoresist film 114 on the silicide blocking layer 113, an exposure and development process is performed relative to the fourth photoresist film 114 such that an area in which silicide will be later formed can be defined.

After that, the exposed part of the silicide blocking layer 113 and the TEOS layer 109 are selectively removed using the fourth photoresist film 114 as a mask such that the surface of the high-density N+ type diffusion area 112 is exposed.

Referring to FIG. 3h, after removing the fourth photoresist film 114 and depositing a refractory metal layer on the entire surface of the semiconductor substrate 100, a heat treatment process is performed, thereby forming a metal silicide layer 115 on the surface of the high-density N+ type diffusion area 112.

Then, a portion of the refractory metal layer, which has not reacted with the semiconductor substrate 100, is removed.

Referring to FIG. 3i, a nitride layer is deposited on the entire surface of the semiconductor substrate 100 so as to form a diffusion blocking nitride layer 116. Then, an interlayer dielectric layer 117 is formed on the diffusion blocking nitride layer 116.

After that, although not shown, power lines, color filter layers, micro lenses, etc. are formed on the interlayer dielectric layer 117, thereby forming a CMOS image sensor.

Currently, a common method for manufacturing the CMOS image sensor employs technology having the scale ranging from 0.35 μm to 0.18 μm.

Moreover, as the chip becomes highly integrated, the development of technology having the scale of 0.18 μm or less has become competitive. Meanwhile, the thermal budget is seriously restricted in the technology having the scale of 0.25 μm or more. This restriction is derived from the use of silicide. After a silicide is formed, a high temperature process (800° C. or more) is restricted from being performed, so it is difficult to remove impurities causing a dark current.

Meanwhile, in the conventional method, the heat treatment process for the LDD area and the photodiode area, and the heat treatment process after source and drain ion implantation can be performed at the temperature of 800° C. or higher so as to recover the damage of a lattice and to activate the process. However, the temperature of a heat treatment process related to the interlayer dielectric layer 117 is restricted.

Thus, in order to form the metal silicide layer 115 and to realize the shallow junction, the heat treatment process is performed at the temperature of 700° C. or less.

The interlayer dielectric layer 117 may include a BPSG-based insulating layer, and as the temperature becomes higher, the gettering effects for impurities regarding the BPSG become more efficient so as to enhance the dark current in the process of manufacturing the image sensor. However, it is difficult to realize such effects through performing the heat treatment process under the above-mentioned temperature.

In addition, before forming the interlayer dielectric layer 117, the diffusion barrier 116 including the nitride layer is formed, so the photodiode area is reduced when scaling down, so that the dynamic range is reduced. As a result, light transmittance decreases, making it difficult to reproduce the images.

BRIEF SUMMARY

Accordingly, an object of the present invention is to provide a method for manufacturing a CMOS image sensor, capable of minimizing or preventing a dark current by improving impurity absorption capability of an impurity gettering layer. In order to accomplish this object, embodiments of the present invention provide a method for manufacturing a CMOS image sensor, the method comprising: forming a gate electrode on a semiconductor substrate with a gate insulating layer interposed therebetween; forming a photodiode area in a surface of the semiconductor substrate at one side of the gate electrode; forming an LDD area in the surface of the semiconductor substrate at an other side of the gate electrode; forming an interlayer dielectric layer on an entire surface of the semiconductor substrate, and then selectively removing the interlayer dielectric layer such that the interlayer dielectric layer remains only on the photodiode area; performing a primary heat treatment process relative to the semiconductor substrate; sequentially forming a first insulating layer and a second insulating layer on the entire surface of the semiconductor substrate in which etching selectivity of the first insulating layer is different from etching selectivity of the second insulating layer; forming a second insulating layer sidewall at both sides of the gate electrode by selectively etching the second insulating layer; selectively removing the first insulating layer except for the first insulating layer on the photodiode area; forming a high-density N type diffusion area in the surface of the semiconductor substrate at the other side of the gate electrode; performing a secondary heat treatment process on the entire surface of the semiconductor substrate; and forming a metal silicide layer on a surface of the high-density N type diffusion area.

The method for manufacturing the CMOS image sensor according to embodiments of the present invention has the following advantages. First, since the impurity is efficiently removed by employing the gettering layer of impurity and the high temperature heat treatment process, it is possible to decrease the dark current. Second, since the damage of the substrate can be prevented by the interlayer dielectric layer when the sidewalls are formed, it is possible to decrease the dark current. Third, the dark current is decreased thereby improving the color reproduction, so it is possible to improve the resolution of the image sensor.

DETAILED DESCRIPTION OF THE INVENTION

Hereinafter, a method for manufacturing a CMOS image sensor according to preferred embodiments of the present invention will be described with reference to the accompanying drawings.

FIGS. 4a through 4j are sectional views showing a procedure for manufacturing a CMOS image sensor according to an embodiment of the present invention.

Figure 1:
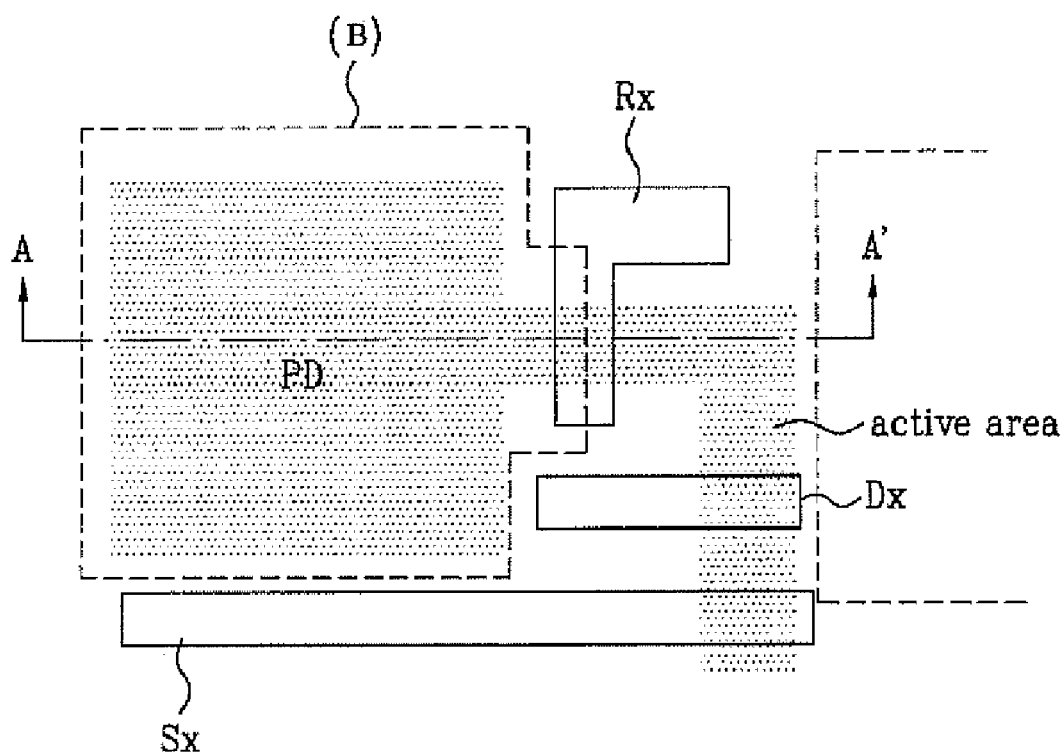
FIG. 1 is a layout view illustrating the unit pixel of a conventional 3T-type CMOS image sensor.
Figure 2:
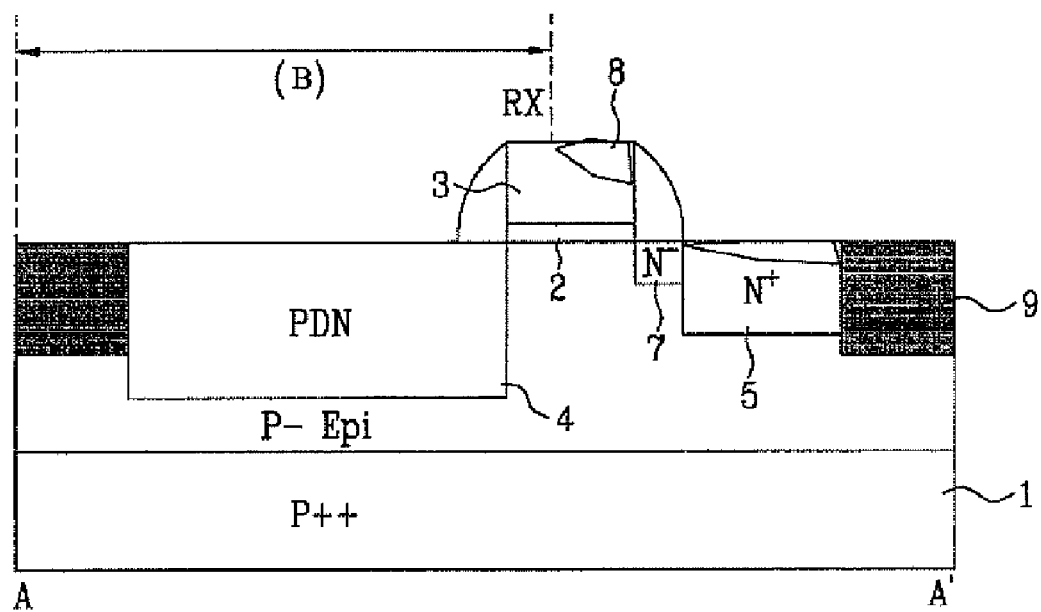
FIG. 2 is a sectional view taken along line A-A' of FIG. 1 illustrating a conventional CMOS image sensor.
Figure 3A:
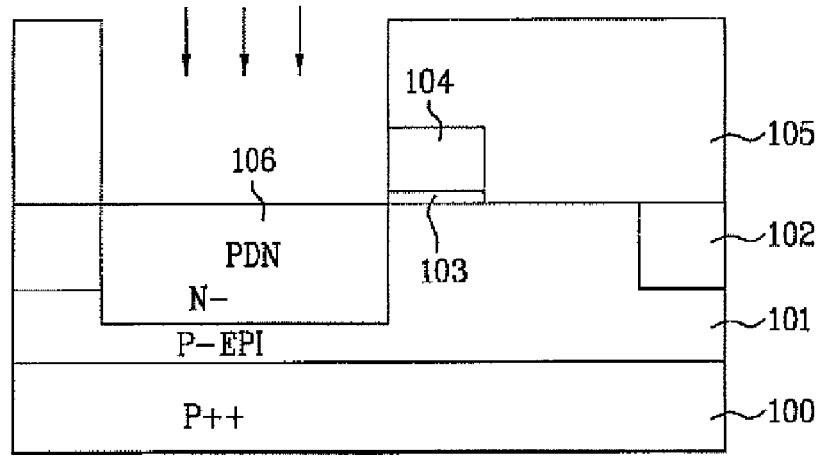
FIGS. 3a through 3i are sectional views showing the procedure for manufacturing a conventional CMOS image sensor.
Figure 3B:
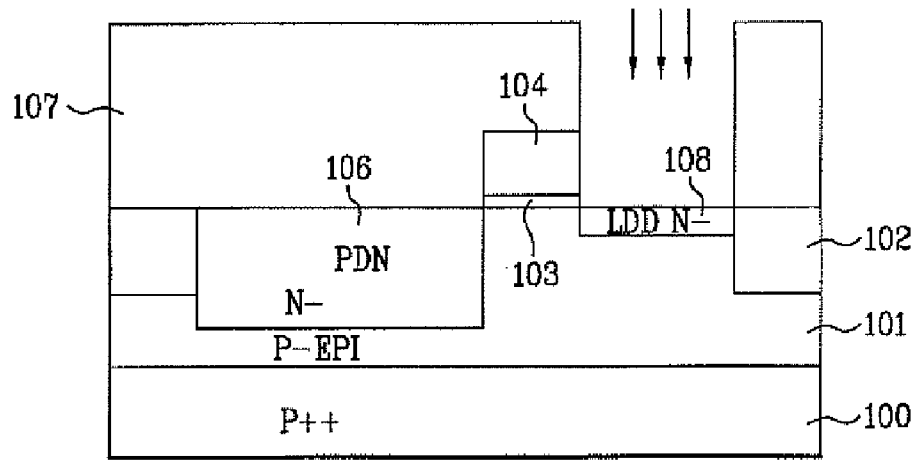
Figure 3C:
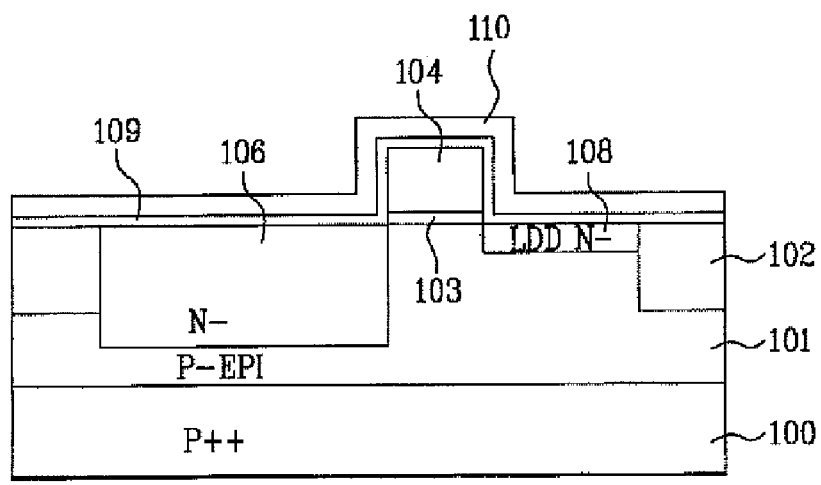
Figure 3D:
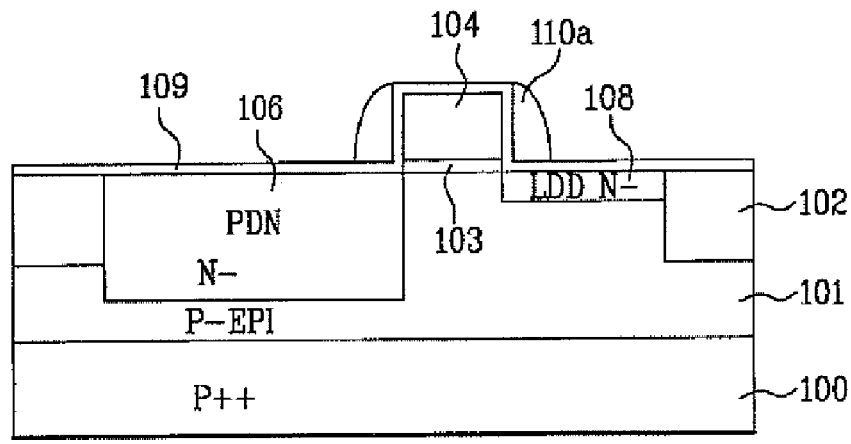
Figure 3E:
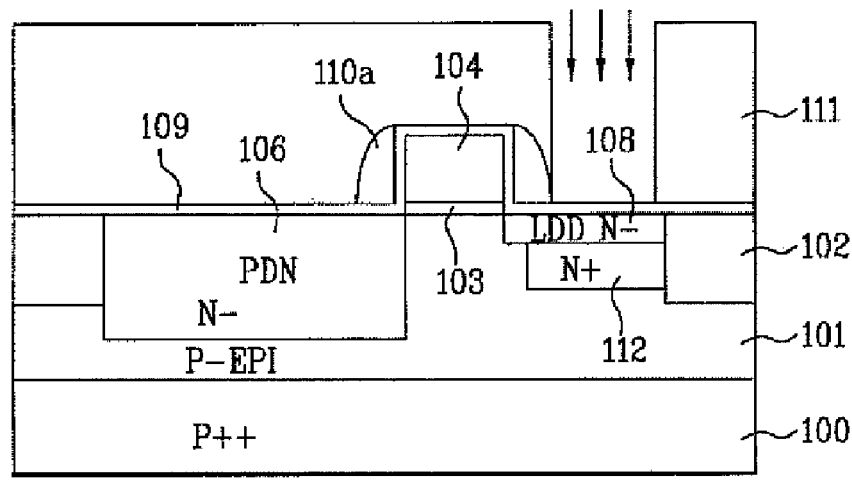
Figure 3F:
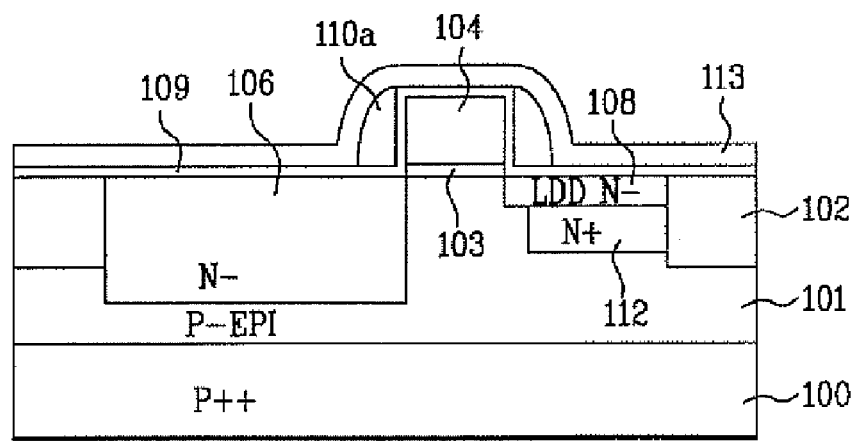
Figure 3G:
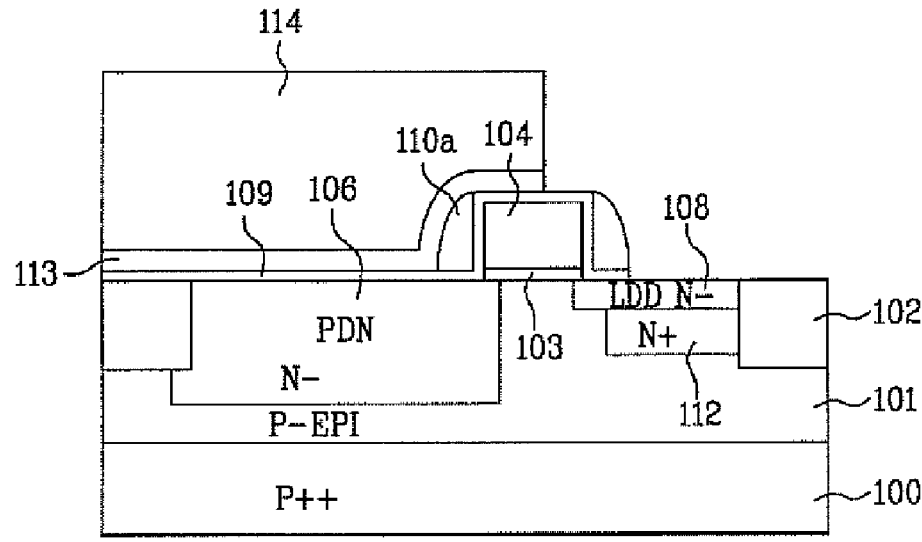
Figure 3H:
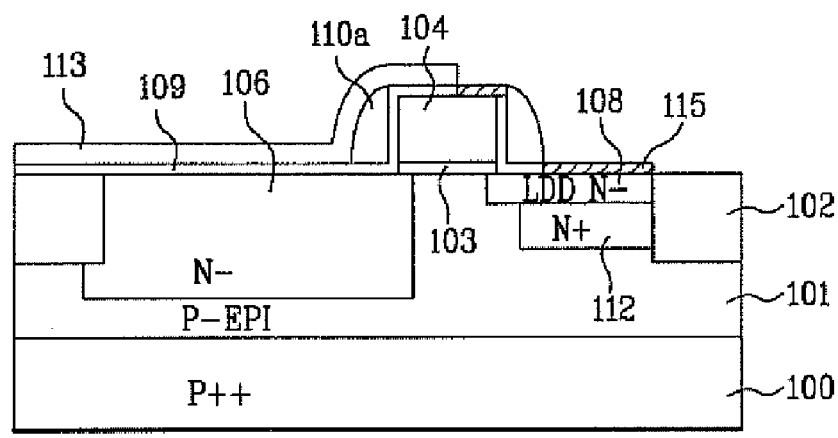
Figure 3I:
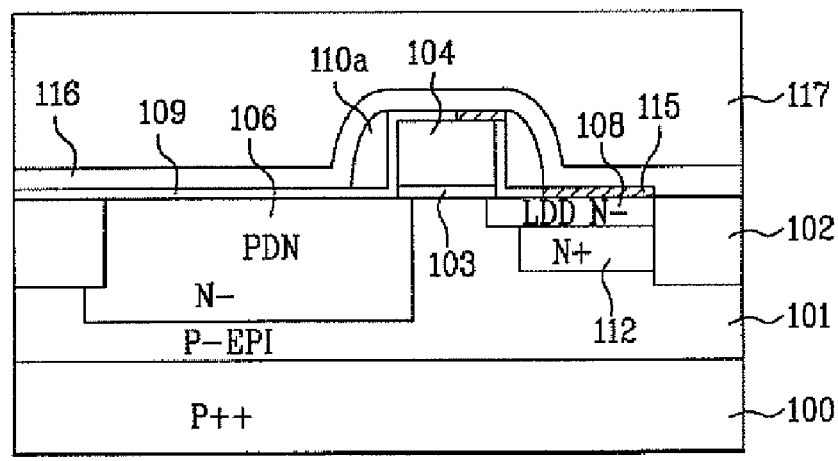
Figure 4A:
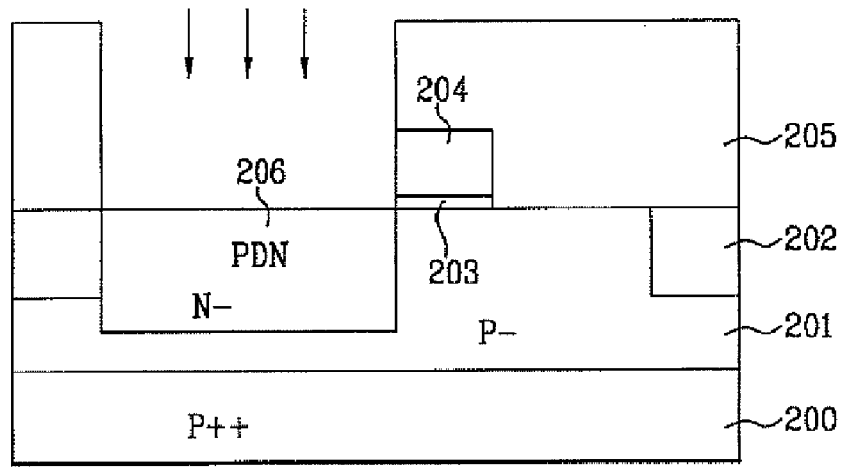
FIGS. 4a through 4j are sectional views showing a procedure for manufacturing a CMOS image sensor according to an embodiment of the present invention.

Referring to FIG. 4a, an epitaxial process can be performed relative to a semiconductor substrate 200 formed of a high-density first conductive (P++ type) multi-crystalline silicon, thereby forming a low-density first conductive (P− type) epitaxial layer 201.

Here, the epitaxial layer 201 enlarges and deepens a depletion region of the photodiode, thereby increasing the capability and the photo sensitivity of a low-voltage photodiode for collecting optical charges.

Then, a photodiode area, transistor area and an isolation area can be defined on the semiconductor substrate 200, and a STI process or a LOCOS process can be performed to form an isolation layer 202 on the isolation area.

Subsequently a gate insulating layer 203 and a conductive layer (for example, a high-density multi-crystalline silicon layer) can be sequentially deposited on the entire surface of the epitaxial layer 201 having the isolation layer 202. The conductive layer and the gate insulating layer 203 can be selectively removed to form a gate electrode 204 of each transistor.

Here, the gate insulating layer 203 can be formed through a thermal oxidation process or a CVD process. In a further embodiment the gate electrode include a silicide layer formed on the conductive layer.

A thermal oxidation layer (not shown) can be formed by performing a thermal oxidation process on the surface of the gate electrode 204 and the semiconductor substrate 200.

In addition, the width of the gate electrode 204 can be formed wider than that of a conventional gate electrode so as to reflect the increased rate of thickness of the thermal oxidation layer.

Then, referring again to FIG. 4a, a first photoresist film 205 can be coated on the entire surface of the semiconductor substrate 200 including the gate electrode 204, and then an exposure and development process is performed to pattern the first photoresist film 205 such that the photodiode area can be exposed.

Thereafter, low-density second conductive type (N− type) dopants can be implanted into the exposed photodiode area using the patterned first photoresist film 205 as a mask, thereby forming a PDN area 206.

Figure 4B:
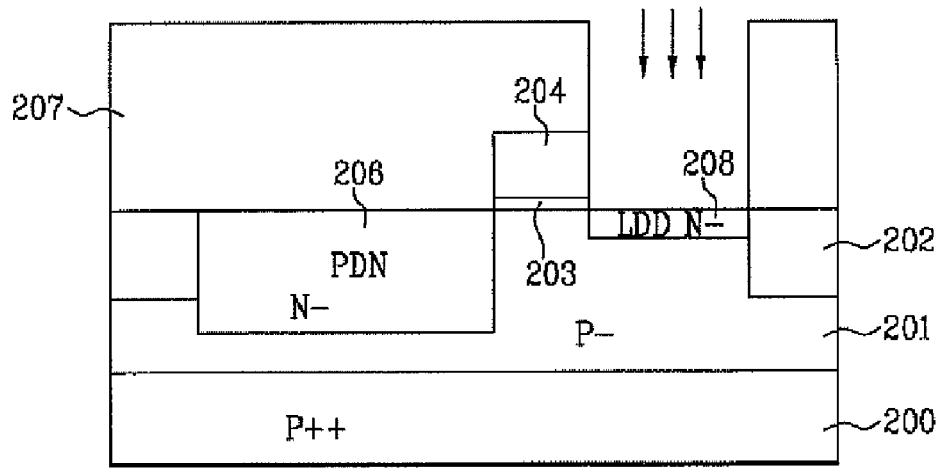

Referring to FIG. 4b, after completely removing the first photoresist film 205, a second photoresist film 207 can be coated on the entire surface of the semiconductor substrate 200. Then, an exposure and development process can be performed relative to the second photoresist film 207 such that the transistor area can be exposed. Thereafter, low-density second conductive type (N− type) dopants can be implanted into the epitaxial layer 201 using the second photoresist film 207 as a mask to form a LDD area 208 in the transistor area.

The PDN area 206 is formed deeper than the LDD area 208 because dopants are implanted into the photodiode area with higher energy to form the PDN area 206.

Figure 4C:
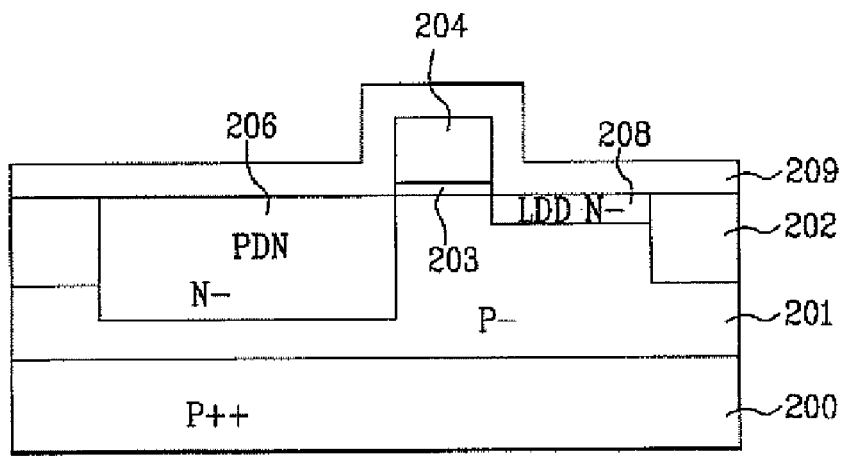

Referring to FIG. 4c, after completely removing the second photoresist film 207, a first interlayer dielectric layer 209 can be formed on the semiconductor substrate 200.

In a specific embodiment, the first interlayer dielectric layer 209 can be formed by depositing a BPSG or a silane (SiH4)-based insulating layer.

In an embodiment, the first interlayer dielectric layer 209 can be formed to have the thickness ranging from 400 Å to 3000 Å by taking a process margin for excessive etching of a diffusion blocking nitride layer into consideration.

The first interlayer dielectric layer 209 prevents the damage of the substrate during formation of a second insulating layer sidewall. In addition, the first interlayer dielectric layer 209 can be used as a gettering layer for impurities, so a dark current can be efficiently decreased by performing a high temperature heat treatment process later.

Figure 4D:
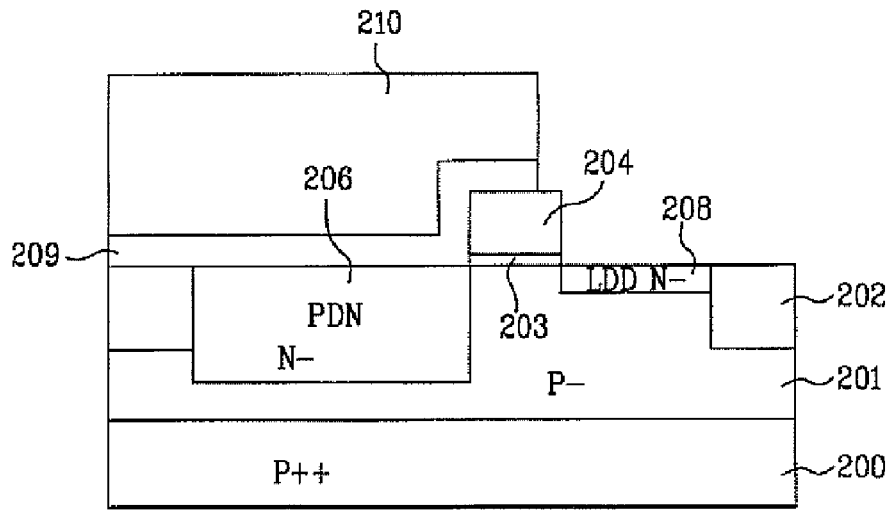

Referring to FIG. 4d, after coating a third photoresist film 210 on the first interlayer dielectric layer 209, an exposure and development process is performed relative to the third photoresist film 210 such that the third photoresist film 210 remains only on the photodiode area.

Thereafter, the first interlayer dielectric layer 209 can be selectively removed using the third photoresist film 210 as a mask.

Figure 4E:
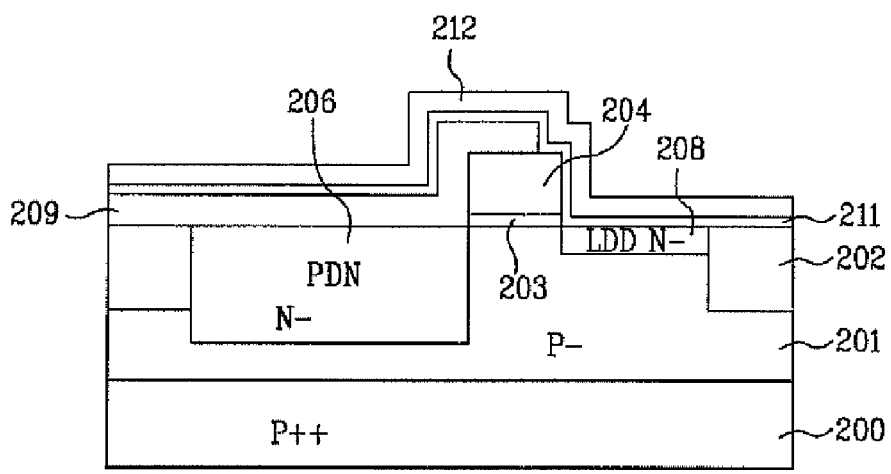

Referring to FIG. 4e, after completely removing the third photoresist film 210, a first insulating layer 211 and a second insulating layer 212 can be sequentially deposited on the entire surface of the semiconductor substrate 200 through, for example, a chemical vapor deposition process (a low pressure chemical vapor deposition process). In this case, the etching selectivity of the first insulating layer 211 is different from that of the second insulating layer 212.

Here, the first insulating layer 211 can include an oxide layer having a thickness of about 200 Å, and the second insulating layer 212 can include a nitride layer.

The oxide layer may include a thermal oxidation layer or a TEOS-based oxide layer.

Figure 4F:
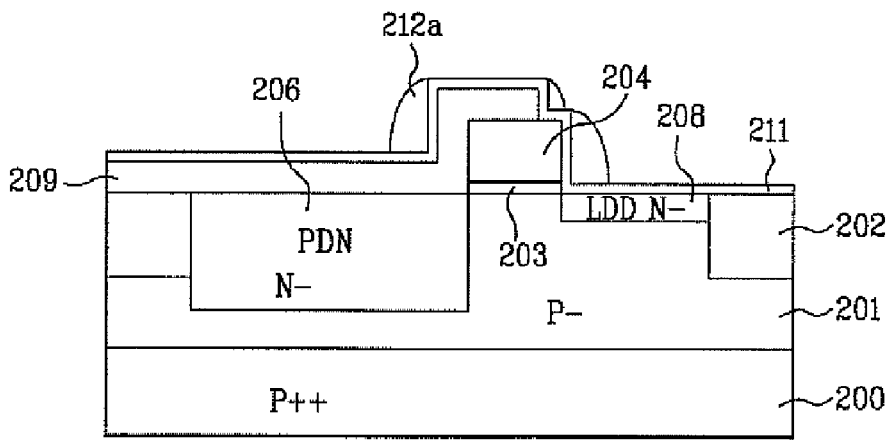

Referring to FIG. 4f, since the etching selectivity of the first insulating layer 211 is different from that of the second insulating layer 212, a second insulating layer sidewall 212a can be formed at both sides of the gate electrode 204 by performing an etch-back process on the entire surface of the second insulating layer 212.

In one embodiment the entire surface of the second insulating layer 212 and the first insulating layer 211 can be etched, so as to form first and second insulating layer sidewalls.

Figure 4G:
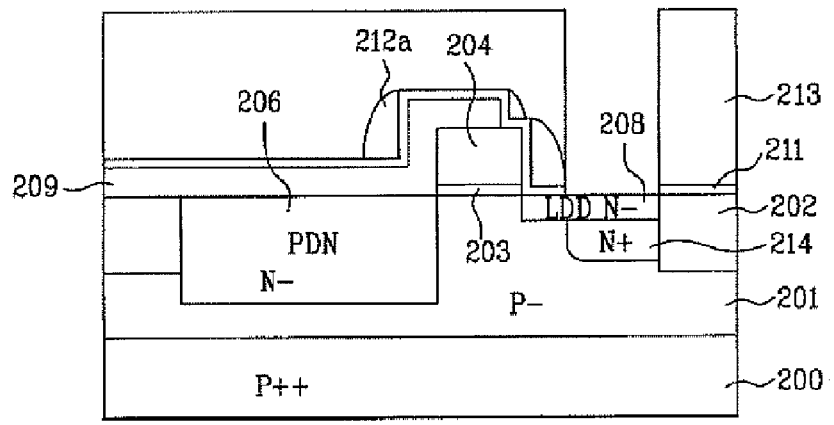

Referring FIG. 4g, after coating a fourth photoresist film 213 on the entire surface of the semiconductor substrate 200, an exposure and development process can be performed relative to the fourth photoresist film 213 such that the fourth photoresist film 213 remains on the photodiode area and the isolation layer 202 while exposing the source/drain area of the transistor.

Thereafter, the exposed first insulating layer 211 is selectively etched using the fourth photoresist film 213 as a mask.

Then, high-density second conductive type (N+ type) dopants can be implanted into the transistor area on the semiconductor substrate 200, thereby forming a high-density N+ type diffusion area 214.

Figure 4H:
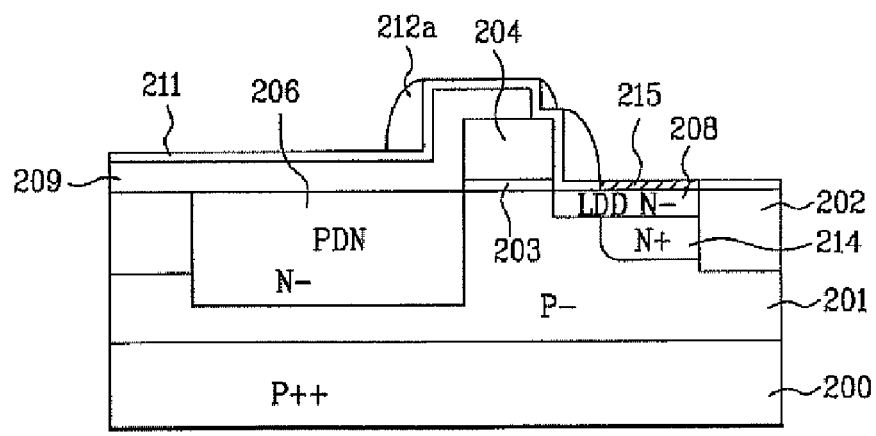

Referring to FIG. 4h, after removing the fourth photoresist film 213, a heat treatment process (such as a rapid thermal process) can be performed relative to the semiconductor substrate 200 at a temperature ranging from 800° C. to 1200° C., thereby diffusing dopants in the PDN area 206, the LDD area 208 and the high-density N+ type diffusion area 214.

In an embodiment, a primary heat treatment process can be performed after the PDN area 206 and the LDD area 208 are formed, and a secondary heat treatment process can be performed after the high-density N+ type diffusion area 214 is formed.

In addition, while the primary heat treatment process is being performed after the PDN area 206 and the LDD area 208 have been formed, a thermal oxidation layer (not shown) having a thickness ranging from 20 Å to 100 Å can be grown on the surface of the gate electrode 204 after the first interlayer dielectric layer 209 is removed.

Then after depositing a refractory metal layer on the entire surface of the semiconductor substrate 200, a heat treatment process can be performed to form a metal silicide layer 215 on the surface of the high-density N+ type diffusion area 214.

Figure 4I:
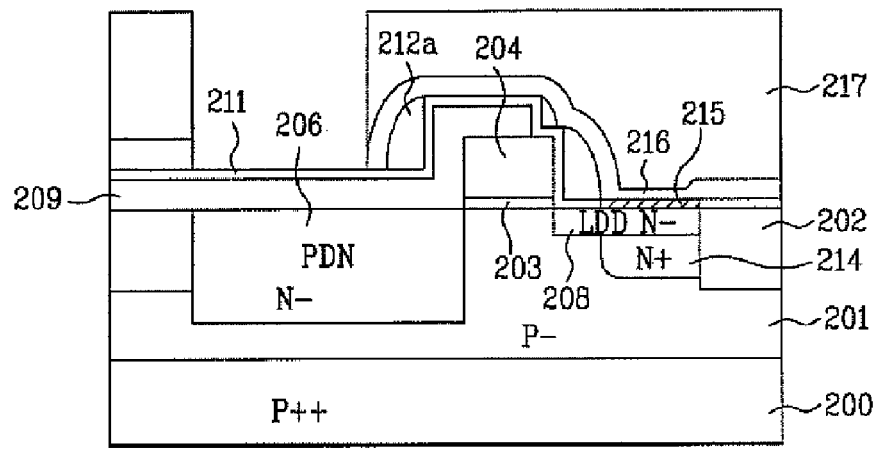

Referring to FIG. 4i, a diffusion blocking nitride layer 216 can be formed on the entire surface of the semiconductor substrate 200, and a fifth photoresist film 217 can be coated on the diffusion blocking nitride layer 216. Then, an exposure and development process can be performed relative to the fifth photoresist film 217 such that the fifth photoresist film 217 exposes the photodiode area.

Thereafter, the part of the diffusion blocking nitride layer 216 formed on the top of the photodiode area can be selectively removed using the fifth photoresist film 217 as a mask.

Figure 4J:
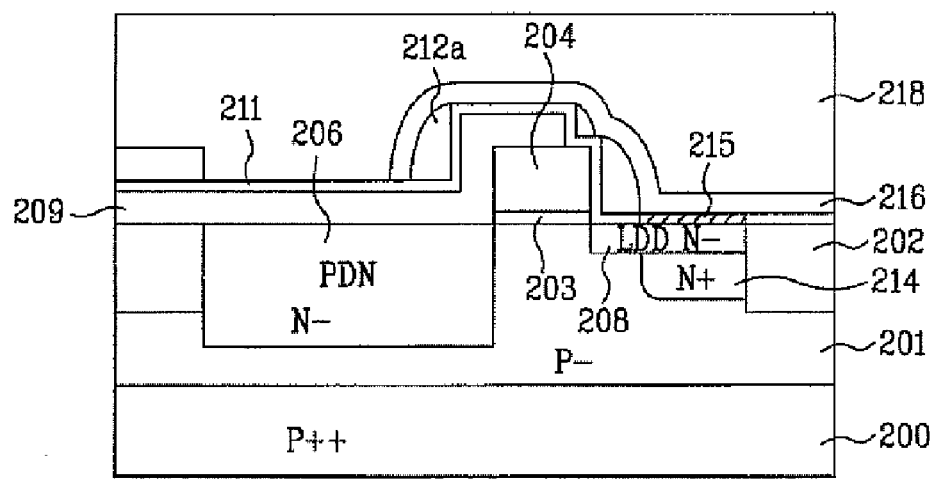

Referring to FIG. 4j, after removing the fifth photoresist film 217, a second interlayer dielectric layer 218 can be formed on the entire surface of the semiconductor substrate 200.

Herein, the second interlayer dielectric layer 218 may include a silane-based interlayer dielectric layer. In this case, since a great amount of hydrogen ions exist in the interlayer dielectric layer, a dangling bond of the semiconductor substrate 200 can be recovered, so it is possible to efficiently decrease the dark current.

In addition, when manufacturing the CMOS image sensor according to embodiments of the present invention, after performing an ion-implantation process to form the LDD area and the photodiode area, a thermal oxidation layer can be formed on the surface of the substrate by performing a heat treatment process at a high temperature ranging from 800° C. to 1200° C. Thus, when the first interlayer dielectric layer 209 is selectively removed, damage to the exposed gate electrode 204 can be recovered, so it is possible to improve the reliability of the device.

Meanwhile, it will be apparent to those skilled in the art that various modifications and variations can be made in the present invention. Thus, it is intended that the present invention covers the modifications and variations thereof within the scope of the appended claims.

As described above, the method for manufacturing the CMOS image sensor according to embodiments of the present invention has the following advantages.

First, since impurities can be efficiently removed by employing the impurity gettering layer and the high temperature heat treatment process, it is possible to decrease the dark current.

Second, since the damage to the substrate during formation of the sidewalls can be prevented by the interlayer dielectric layer, it is possible to decrease the dark current.

Third, the dark current is decreased thereby improving the color reproduction, so it is possible to improve the resolution of the image sensor.

It should be understood that the examples and embodiments described herein are for illustrative purposes only and that various modifications or changes in light thereof will be suggested to persons skilled in the art and are to be included within the spirit and purview of this application.

I claim:

1. A method for manufacturing a CMOS image sensor, comprising:
    forming a gate electrode on a semiconductor substrate having a gate insulating layer interposed therebetween;
    forming a photodiode area in a surface of the semiconductor substrate at one side of the gate electrode;
    forming an LDD area in the surface of the semiconductor substrate at a second side of the gate electrode;
    forming an interlayer dielectric layer on an entire surface of the semiconductor substrate, and then selectively removing the interlayer dielectric layer such that a portion of the interlayer dielectric layer remains on the photodiode area;
    performing a first heat treatment after selectively removing the interlayer dielectric layer;
    sequentially forming a first insulating layer and a second insulating layer on the entire surface of the semiconductor substrate after performing the first heat treatment, wherein an etching selectivity of the first insulating layer is different from an etching selectivity of the second insulating layer;
    forming a second insulating layer sidewall at sides of the gate electrode by selectively etching the second insulating layer;
    selectively removing the first insulating layer from a source/drain area of the semiconductor substrate;
    forming a high-density N type diffusion area in the source/drain area of the semiconductor substrate;
    performing a second heat treatment process after forming the high-density N type diffusion area; and
    forming a metal silicide layer on a surface of the high-density N type diffusion area.

2. The method according to claim 1, wherein the first insulating layer comprises an oxide layer.

3. The method according to claim 2, wherein the first insulating layer comprises a thermal oxidation layer or a TEOS-based oxide layer.

4. The method according to claim 1, wherein the second insulating layer comprises a nitride layer.

5. The method according to claim 1, wherein the interlayer dielectric layer comprises a BPSG or a silane-based insulating layer.

6. The method according to claim 1, wherein the interlayer dielectric layer has a thickness of 400 Å to 3000 Å.

7. The method according to claim 1, wherein the first heat treatment process and the second heat treatment process is performed at a temperature ranging from 800° C. to 1200° C.

8. The method according to claim 1, wherein performing the first heat treatment process comprises forming a thermal oxidation layer having a thickness of 20 Å to 100 Å.

* * * * *